United States Patent

Boleky, III

[15] 3,699,403

[45] Oct. 17, 1972

[54] FUSIBLE SEMICONDUCTOR DEVICE INCLUDING MEANS FOR REDUCING THE REQUIRED FUSING CURRENT

[72] Inventor: Edward Joseph Boleky, III, Cranbury, N.J.

[73] Assignee: RCA Corporation

[22] Filed: Oct. 23, 1970

[21] Appl. No.: 83,423

[52] U.S. Cl. .........317/235 R, 317/234 N, 317/234 J, 340/173, 29/585

[51] Int. Cl. ............................H01l 5/00, H01l 11/00

[58] Field of Search........317/234, 235, 4, 4.1, 5, 5.4, 317/33, 40, 101; 29/573, 585, 578; 340/173

[56] References Cited

UNITED STATES PATENTS

| | | | |
|---|---|---|---|
| 3,384,879 | 5/1968 | Stahl et al. | 340/173 |
| 3,543,102 | 11/1970 | Dahlberg et al. | 317/101 |
| 3,377,513 | 4/1968 | Ashby et al. | 317/234 |
| 3,555,365 | 1/1971 | Forlani et al. | 317/235 X |
| 3,564,354 | 2/1971 | Aoki et al. | 317/234 X |
| 3,575,645 | 4/1971 | Doversberger | 317/234 |

*Primary Examiner*—John W. Huckert
*Assistant Examiner*—Andrew J. James
*Attorney*—Glenn H. Bruestle

[57] ABSTRACT

Information storing devices, such as read-only-memories, comprise an array of semiconductor components on a substrate, each component being connected into the array by a fuse. A continuous electrically resistive element is disposed on the substrate, the fuses being disposed on the element. To open-circuit selected ones of the fuses, a current is passed through the element to heat all the fuses to a temperature approaching but less than the melting point of the fuses, and a current is passed through only the selected fuses to further heat them to the fusing temperature thereof.

7 Claims, 7 Drawing Figures

INVENTOR.
EDWARD JOSEPH BOLEKY, III
BY M.Y. Epstein
Attorney

INVENTOR.
EDWARD JOSEPH BOLEKY, III
BY M.Y. Epstein
Attorney

FUSIBLE SEMICONDUCTOR DEVICE INCLUDING MEANS FOR REDUCING THE REQUIRED FUSING CURRENT

BACKGROUND OF THE INVENTION

This invention relates to semiconductor devices, and particularly to semiconductor devices having utility in information handling systems, the devices including fuses as logic determining elements thereof.

An example of such devices is an integrated circuit having utility as a read-only memory for use in computers. Such device comprises a plurality of individual semiconductor components, e.g., diodes, arrayed in an *x–y* matrix by means of two crossed, orthogonal sets of connector strips, each component being disposed adjacent to an intersection of a pair of strips, and being electrically connected between the pair.

To encode the matrix, i.e., provide information to be stored therein, selected ones of the components are disconnected from the matrix. To this end, each component is electrically connected to one of its connector strips by means of a fuse. Selected ones of the components are disconnected from the matrix by causing a fusing current, i.e., a current sufficiently high to electrically heat the fuse to the melting point thereof, to pass through the selected components and the fuses in series therewith.

A disadvantage of this arrangement arises from the fact that the fuses serve the alternative roles as either fuses to be selectively opened, or as electrical connectors for the components remaining in the matrix. Because, for the purpose of obtaining low voltage operation of the semiconductor device, it is desired that the impedance of the component circuits be low, the resistance of the fuses is also preferably low. This gives rise, in the prior art devices described, of the need for comparatively large fusing currents. A problem with the use of large fusing currents is that the passage of the fusing current through the semiconductor component in series with the fuse can result, prior to the burn-out of the fuse, in a change in characteristics of the semiconductor component which prevents fuse burn-out. For example, a large current can convert the PN junction of the component into a large resistance which immediately reduces the current to an amplitude less than the required fusing current. Thus, the semiconductor component remains in the matrix. Also, the need for high fusing currents requires the use of relatively large voltages across the series combination of fuse and semiconductor component. The use of such large voltages, as known, can cause fusing currents to pass through other elements of the matrix which are electrically connected in parallel to the selected element. Thus, other elements of the matrix, intended to remain in the matrix, are disconnected therefrom.

For the purpose of reducing the fusing current required to blow the fuses, it has been suggested to supplement the heat provided by the fusing current by an additional heating means, e.g., a heating pad on which the device is placed, whereby the fusing current can be reduced. A difficulty, in some instances, of implementing this process is that of providing a simple and convenient means of supplementally heating the fuses to a significant extent while not heating other portions of the device to temperatures causing damage thereto.

DESCRIPTION OF PREFERRED EMBODIMENTS OF THE INVENTION

The present invention is described in connection with semiconductor devices of the type having utility in the memory systems of computers, such devices being known as read-only-memories.

Figures 1, 2:
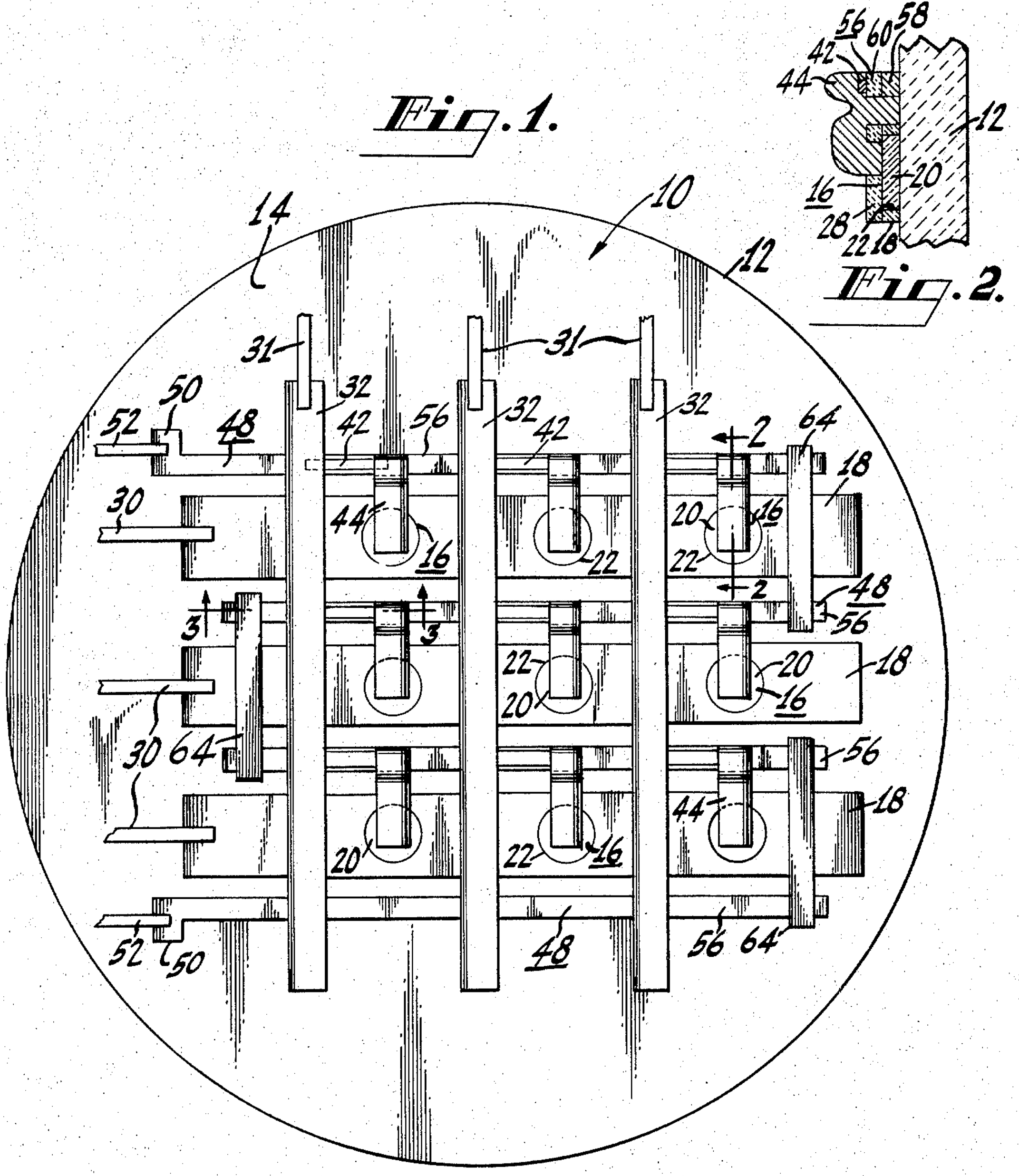
FIG. 1 is a plan view of a semiconductor device in accordance with the instant invention.
FIGS. 2 and 3 are sections along lines 2—2 and 3—3, respectively, of FIG. 1.
Figure 3:
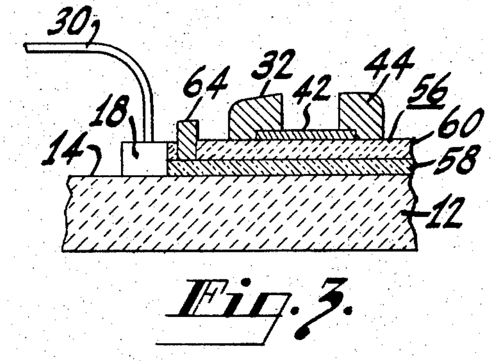

With reference to FIGS. 1, 2, and 3 a read-only-memory device 10 is shown which comprises a flat substrate 12 of, in this embodiment, a dielectric material, e.g., sapphire. The substrate 12, depending upon the device being fabricated, can comprise any of several materials, e.g., metals, ceramics, semiconductors, or the like. On one surface 14 of the substrate 12 are a plurality of semiconductor components 16, diodes in the instant embodiment, arranged in an array of rows and columns.

Each diode 16 is an integral portion of an elongated laterally extending strip 18 of a semiconductor material on the substrate surface 14, the strips 18 comprising row connectors for the diodes 16. In this embodiment, the strips 18 comprise N type conductivity silicon. Circular regions 20 of the strips 18 are doped to P type conductivity, thus providing PN junctions 22 for the diodes 16.

Covering each of the strips 18 is a layer 28 (FIG. 2) of an insulating material, e.g., silicon dioxide, silicon nitride, or the like. Fine wires 30 (FIG. 1) are connected to end portions of the strips 18 through openings through the insulating layer 28.

Crossing the strips 18, and being separated therefrom by the layer 28, are a plurality of metal strips 32. The metal strips 32 comprise column connectors for each of the diodes 16, and are connected to the diodes by means of a serial combination of fuses 42 and links 44, the fuses being connected to the column strips 32, and the links 44 being connected to the P regions 20 of the diodes 16 through openings (FIG. 2) through the insulating layer 28. Fine wires 31 are connected to end portions of the column strips 32.

To the extend so far described, the device 10 is similar to known prior art devices. Included on the substrate 12 is, however, an electrically continuous heater bar 48 having two end portions 50 to which fine wires 52 are connected. The heater bar 48 comprises four laterally extending strands 56 each comprising a layer 58 (FIG. 3) of an electrically resistive material, e.g., N type conductivity silicon, and a covering layer 60 of an electrically and thermally insulating material, such as silicon dioxide, silicon nitride, or the like. The fuses 42 are disposed on the heater strands 56, the layer 60 of the strands 56 electrically isolating the fuses 42 from the layer 58 of the strands. Adjacent end portions of adjacent heater strands 56 are joined by connector members 64 (FIG. 1) of a metal, e.g., aluminum, titanium, nickel, or tungsten. The connector members 64 cross the row strips 18 but are electrically isolated therefrom by means of the insulating layer 28 on the strips. Also, the heater strands 56 pass under the column strips 32 (FIG. 3). The insulating layers 60 of the strands 56 insulate the strips 32 from the conductive layers 58 of the strands.

The read-only-memory device 10 shown in FIGS. 1, 2, and 3 is normally mounted within an envelope including terminal means which are connected to each of the fine wires 30, 31 and 52. Envelopes suitable for this purpose are well known; accordingly, an example thereof is not provided.

The fabrication of the device 10 is as follows.

Starting with a thin, flat substrate 12 (FIG. 4) of sapphire, a thin layer 70 of N doped silicon is epitaxially grown on a surface 14 of the substrate. Means for epitaxially growing silicon on a dielectric substrate are known.

Using standard masking and etching techniques, portions of the silicon layer 70 are then removed leaving a pattern (FIG. 5) of spaced laterally extending strips providing the row strips 18 and the layer 58 of the heater strands 56 (FIG. 3). Since, as described, the row strips 18 and the heater layers 58 are provided in the same deposition step, the conductivity characteristics of the strips 18 and the layers 58 are the same. Alternatively, using known masking techniques, the conductivity characteristics of the strips 18 or the layers 58 can be modified by known doping techniques.

Spaced circular portions 20 of each strip are then converted to P conductivity type, using, e.g., standard masking and doping techniques.

Figures 4, 5, 6, 7:
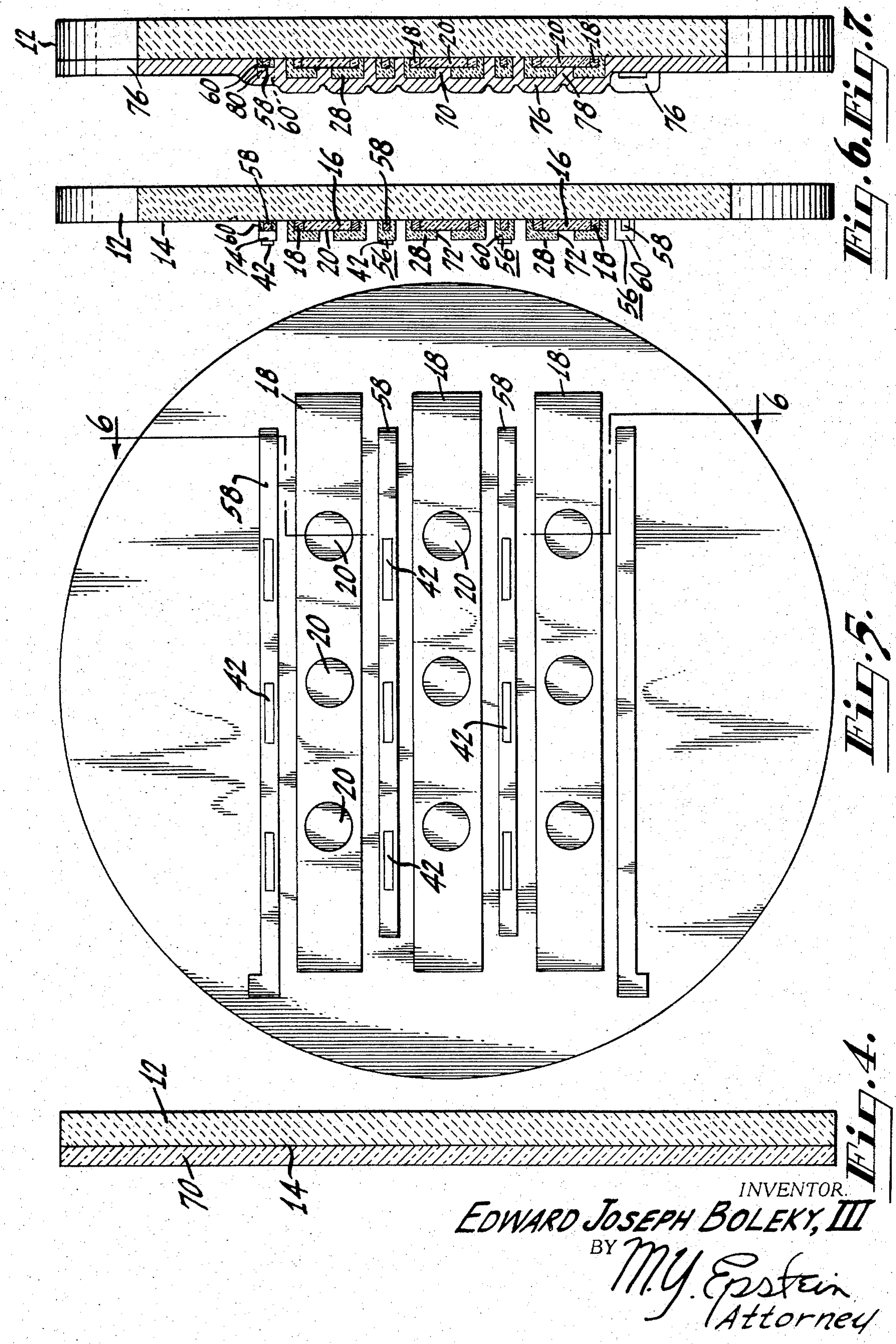
FIG. 4 is a sectional view of a workpiece substrate showing an initial step in the fabrication of the device shown in FIG. 1.
FIG. 5 is a plan view of the workpiece showing the results of subsequent processing thereof.
FIG. 6 is a section along lines 6—6 of FIG. 5.
FIG. 7 is a view similar to that of FIG. 7, but at a later step in the processing of the workpiece.

Thereafter, as illustrated in FIG. 6, the row strips 18 and the layers 58 of the heater strands 56 are covered with layers 28 and 60, respectively, of an insulating material. In this embodiment, the layers 28 and 60 comprise silicon dioxide provided, for example, by thermally converting a surface portion of the silicon to the oxide, in accordance with known processes. Openings 72 and 74 are then selectively etched through the layers 28 and 60, respectively, to expose a surface portion of the P type portions 20 of the row strips 18, and to expose surface portions of the layers 58 near the ends of the heater strands 56. Also, although not shown in FIG. 6, openings are made through the insulating layers 28 and 60 to expose those surface portions of the strand layers 58 and the row connector layers 18 to which the fine wires 52 and 30, respectively, are to be bonded.

The entire surface of the workpiece is then coated with a layer of the material of which the fuses 42 are made, e.g., doped silicon, lead, aluminum, or other known fuse materials, and the layer is defined, using known processes, e.g., photolithographic techniques, to leave the fuses 42 overlying portions of the heater strands 56, as shown in FIG. 5.

Then the entire surface of the workpiece is coated with a metal layer 76 (FIG. 7), of the material of the column strips 32 and the links 44, e.g., aluminum, gold, titanium, nickel, or the like. Portions 78 of the metal layer 76 extend through the openings 72 through the insulating layer 28 and cover the previously exposed surface portions of the P type portions 20 of the row strips 18. Also, portions 80 of the metal layer 76 extend through the openings through the insulating layer 60 and cover the previously exposed surface portions of the heater layers 58.

Using known masking and etching techniques, portions of the metal layer 76 are then removed leaving the pattern shown in FIG. 1. That is, the layer 76 is defined to provide the column strips 32, the connecting links 44, and the heater bar 48 connecting members 64. Both the strips 32 and the links 44 overlie ends of the fuses 44 (FIG. 3), whereby each diode region 20 is connected to a column strip 32 through a fuse 42.

The various fine wires 30, 31, and 52 are then bonded, as by known ultrasonic bonding techniques, to the various ends of the row and column strips 18 and 32, and to the end portions 50 of the heater bar 48. Then, the workpiece is mounted within a suitable envelope.

After the completion of the above-described steps, either before or after the mounting of the workpiece within an envelope, the device is encoded, i.e., provided with stored information, by disconnecting selected ones of the diodes 16 from the matrix. This is accomplished by fusing (open-circuiting) the fuses 42 connected to the selected ones of the diodes.

As previously noted, the selective fusing of the fuses 42 is accomplished by passing a fusing current through these fuses. To reduce the level of the fusing current required, for the reasons previously explained, all the fuses are heated by a supplemental heating source to a temperature approaching but not equalling the melting temperature of the fuses.

In accordance with the instant invention, this supplemental heating of the fuses 42 is accomplished by passing a current through the heater bar 48 to cause resistive heating of the strand portions 56 of the bar. The heating of the strands 56 causes heating of the fuses 42 disposed thereon.

Advantages of the herein described means for providing the supplemental fuse heating relate to the ease of applying the extra heating, i.e., by appropriate electrical connections to the wires 52, and to the electrical and thermal isolation of the supplemental heating means from other portions of the device. Thus, as described, the heater bar 48 is completely electrically isolated from all other components of the substrate 12, whereby the voltage applied across the bar, and the currents through it, have little or no affect on the matrix of diodes 16. This is particularly desirable since it adds flexibility in the design of both the heater bar 48 and the other components of the device. I.e., the electrical characteristics of the heater bar can be selected substantially independently of the design of the other device components, and vice versa.

The heating provided by the bar 48 is localized, whereby excessive heating of temperature-sensitive portions of the device, e.g., the diodes 16, is avoided. In the instant embodiment, the connector members 64 connecting adjacent ends of the heater strands 56 are of a thick, highly conductive metal, e.g., aluminum, which are substantially unheated by the current therethrough. Thus, the row connectors 18, where crossed by these portions 64 of the bar 48, are not heated.

Although, in the instant embodiment, both the column connectors 32 and the links 44 cross the heater strands 56 and are heated thereby, it is possible, if desired, to form the portions of the strands crossed by these members of a highly conductive metal, such as aluminum, whereby heating of these members can be avoided. Thus, using such a design in which only the portions of the heater bar 48 underlying the fuses 42 are electrically resistive in nature, the fuses 42 can be heated to extremely high temperatures with comparatively little heating of other portions of the device.

Even further thermal isolation of the heater bar 48 from the device components can be achieved by providing a thermally insulating layer between the electrically resistive portions of the bar 48 and the substrate 12. Thus, for example, the heater strands 56 can comprise a first layer of silicon dioxide in contact with the substrate surface, the layer 58 of doped silicon on top of the first layer, and the covering layer 60 of silicon dioxide.

In another embodiment of the invention, not illustrated, the device comprises a conventional integrated circuit of the type comprising a substrate of a semiconductor material, e.g., silicon, and a plurality of semiconductor components formed within the substrate. A fuse heating bar is disposed on the substrate, and fuses are provided disposed on the fuse heating bar. To electrically isolate the fuse bar from the substrate and fuses, the fuse bar comprises a layer of insulating material, e.g., silicon dioxide, in contact with the substrate or other components on the substrate, an electrically resistive material, e.g., doped silicon, overlying the insulative layer, and another layer of insulating material, e.g., silicon dioxide, between the fuse and the resistive material to electrically isolate the fuse from the resistive heating material.

In a specific embodiment, the substrate 12 is of sapphire having a thickness of 10 mils. The silicon row strips 18 have a thickness of 7,500 A. and are doped with phosphorous to a concentration of $1 \times 10^{17}$ atoms/$cm^3$. The P doped portions 20 of the diodes 16 are doped with boron to a concentration of $1 \times 10^{20}$ atoms/$cm^3$. The silicon dioxide layer 28 covering the row strips 18 has a thickness of 5,000 A. The column strips 32 and the links 44 have a thickness in the order of 10,000 A.

The electrical resistance layers 58 of the heater bar 48 are of single-crystal silicon doped with phosphorous to an N type conductivity of about 0.0005 ohm-cm. The layers 58 have a thickness of 7,500 A. and a width of 0.5 mil. The combined length of the various heater strands 56 is about 220 mils. The layers 60 of silicon dioxide covering the layers 58 have a thickness of 5,000 A., and the connector members 64 joining ends of adjacent strands 56 are of aluminum having a thickness of 10,000 A. The electrical resistance of the heater bar 48, at room temperature (25° C.), is about $3.3 \times 10^3$ ohms.

The fuses 42 are of polycrystalline silicon doped with boron to a P type conductivity of 0.003 ohm-cm. The fuses 42 each have a width of 0.4 mil, a length of 2 mils, and a thickness of 5,000 A. The electrical resistance of the fuses 42, at room temperature, is about 280 ohms and, in the absence of a supplemental heating of the fuses, the fuse blowing current is 42 milliamps, d.c.

The amount of supplemental heating provided by the heater bar 48 is dependent upon the voltage applied across the bar between the two ends 50 thereof. In one embodiment, 140 volts, d.c., is used, the current through the bar 48 being 40 milliamps, and the fuses 42 thereby being heated to a temperature in the order of 800° C. With such supplemental heating of the fuses 42, the amount of current through the fuses 42 to cause blowing thereof is 28 milliamps, d.c.

The fuse bar can be fabricated from any material whose melting temperature is equal to or greater than the melting temperature of the fuse material which it supports. It must also be able to withstand the temperatures produced during subsequent processing of the integrated circuit, particularly, the temperatures needed to deposit or grow the insulating layer 60 of the fuse bar and to deposit the fuses 42. Electrical resistance heating materials suitable for the layer 58 of the heater bar 48 include titanium, tungsten, and chromium. Other suitable materials will be evident to persons skilled in the art.

I claim:

1. A semiconductor device comprising:
a substrate,
an array of components on said substrate,
a plurality of fuses associated with various ones of said components,
electric resistance heating means on said substrate, said fuses being disposed in heat-transfer relationship with said heating means, and
means allowing the passage of a current through said heating means independently of the passage of current through said fuses for reducing the fusing current required to open-circuit said fuses.

2. A device as in claim 1 wherein said heating means is electrically isolated from said components.

3. A device as in claim 1 wherein said heating means is, in comparison with the degree of heat transfer relation thereof with said fuses, substantially thermally isolated from said components.

4. A device as in claim 1 wherein said fuses are disposed in contact with said heating means.

5. A device as in claim 1 wherein said heating means comprises a first layer of electrically resistive material and a second layer of electrically insulating material, said second layer providing electrical isolation of said first layer from said components.

6. A device as in claim 5 wherein said fuses are disposed in contact with said second layer.

7. A device as in claim 6 wherein:
said first layer is discontinuous and comprises spaced portions,
electrically conductive means of low resistance join said spaced portions, and said fuses overlie said portions.

* * * * *